United States Patent
Nakamura

[11] Patent Number: 6,077,411
[45] Date of Patent: Jun. 20, 2000

[54] APPARATUS AND PROCESS FOR FORMING ZINC OXIDE FILM AND PROCESS FOR PRODUCING PHOTO-ELECTRICITY GENERATING DEVICE USING THE FILM

[75] Inventor: Tetsuro Nakamura, Kyotanabe, Japan

[73] Assignee: Canon Kabushiki Kaisha, Tokyo, Japan

[21] Appl. No.: 09/008,560

[22] Filed: Jan. 16, 1998

[30] Foreign Application Priority Data

Jan. 16, 1997 [JP] Japan .................................. 9-005434

[51] Int. Cl.$^7$ .............................. C25D 7/06; C25D 17/00; C23C 28/00; C25B 9/00
[52] U.S. Cl. .......................... 205/138; 205/141; 205/199; 204/202; 204/269
[58] Field of Search .................... 204/202, 269; 205/141, 199, 138

[56] References Cited

U.S. PATENT DOCUMENTS 4,124,454  11/1978  Shang .................................. 204/202 X

FOREIGN PATENT DOCUMENTS 8-217443  8/1996  Japan .

OTHER PUBLICATIONS

M.Izaki, "Electrolyte Optimization for Cathodic Growth of Zinc Oxide Films", J. Electrochem. Soc., vol. 143, No. 3, Mar. 1996, L 53–55.

Primary Examiner—Donald R. Valentine
Attorney, Agent, or Firm—Fitzpatrick, Cella, Harper & Scinto

[57] ABSTRACT

An apparatus for forming a zinc oxide film on a sheet substrate including a tank containing an aqueous electrolytic solution containing at least nitrate ions and zinc ions, conveyer means for continuously feeding and conveying an elongated electroconductive sheet substrate having two major surfaces in a direction while dipping a lengthwise portion of the sheet substrate in the electrolytic solution, a counter electrode immersed in the electrolytic solution so as to be opposite to the lengthwise portion of the sheet substrate, and a power supply disposed so as to pass a current between the sheet substrate and the counter electrode, wherein the conveyer means include a plurality of rollers and an endless belt wound about the rollers so as to have a conveyer surface contacting and covering one of the major surfaces of the lengthwise portion of the sheet substrate dipped in the electrolytic solution while moving together with the sheet substrate.

30 Claims, 8 Drawing Sheets

APPARATUS AND PROCESS FOR FORMING ZINC OXIDE FILM AND PROCESS FOR PRODUCING PHOTO-ELECTRICITY GENERATING DEVICE USING THE FILM

FIELD OF THE INVENTION AND RELATED ART

The present invention relates to an apparatus and process for forming a zinc oxide film on an elongated sheet substrate through electrodeposition and a process for producing an photo-electricity generating device using the film.

In a process for producing a photo-electricity generating device, there has been known that a reflection layer of, e.g., metal is formed on the back side of an semiconductor layer in order to improve a light-collection efficiency of the photo-electricity generating device on a long wavelength. Further, there has also been known that a zinc oxide layer having an unevenness is formed between the reflection layer and the semiconductor layer to obtain a light-confining (optical confinement) effect that an optical distance (optical path) of reflected light is lengthened to obtain an effect of suppressing an excessive current flowing at the time of an occurrence of a shunt passing.

Further, there have been reported that the zinc oxide film is formed by electrolysis in an aqueous electrolytic solution containing zinc ions ($Zn^{2+}$) and nitrate ions ($NO_3^-$) as in "Electrolyte Optimization for Cathodic Growth of Zinc Oxide Films", M. IZAKI and T. Omi, J. Electrochem. Soc., Vol. 143, March 1996, L53 or Japanese Laid-Open Patent Application (JP-A) 8-217443. According to this process, the zinc oxide film can be formed at low production costs.

In the case where the photo-electricity generating device is prepared by electrodepositing a zinc oxide film on a substrate and forming a semiconductor layer on the zinc oxide film on both sides of the substrate. If the unnecessary zinc oxide film is formed on the back side of the substrate, subsequent steps including a washing step, drying step and a step of forming overlying layers (e.g., a semiconductor layer) by, e.g., chemical vapor deposition (CVD) can be obstructed.

Further, the formation of the zinc oxide film on both sides of the substrate through electrodeposition requires an amount of a total current which is two times an amount thereof for the electrodeposition of the zinc oxide film on one side of the substrate, thus being undesirable from a viewpoint of cost reduction.

Accordingly, it is necessary to prevent the formation (electrodeposition) of the zinc oxide film on the back side (where overlying layers are not formed) of the substrate. One of the methods for such a purpose is a method wherein a film for preventing direct electrodeposition of the zinc oxide film is preliminarily applied to the back side of the substrate. This method, however, is accompanied with a problem such that additional steps of application and peeling-off of the electrodeposition-preventing film are required.

In the case where the zinc oxide film is formed on a sheet substrate in an elongated or continuous shape, an apparatus for forming the zinc oxide film requires a mechanism for controlling the conveyance direction of the elongated sheet substrate (e.g., a combination of a sensor and auxiliary roller(s) controlled by the sensor) so as to prevent deviation or lateral shift (slippage) of the elongated sheet substrate from a conveyance system.

SUMMARY OF THE INVENTION

In view of the above problems, an object of the present invention is to provide an apparatus for stably forming a zinc oxide film on an elongated electroconductive substrate, particularly in an elongated shape, by electrolytic deposition (electrodeposition).

Another object of the present invention is to provide a process for forming a zinc oxide film.

A further object of the present invention is to provide a process for producing a photo-electricity generating device including the zinc oxide film.

According to the present invention, there is provided an apparatus for forming a zinc oxide film on a sheet substrate, comprising:

a tank containing an aqueous electrolytic solution containing at least nitrate ions and zinc ions, conveyer means for continuously feeding and conveying an elongated electroconductive sheet substrate having two major surfaces in a direction while dipping a lengthwise portion of the sheet substrate in the electrolytic solution, a counter electrode immersed in the electrolytic solution so as to be opposite to the lengthwise portion of the sheet substrate, and a power supply disposed so as to pass a current between the sheet substrate and the counter electrode, wherein the conveyer means include a plurality of rollers and an endless belt wound about the rollers so as to have a conveyer surface contacting and covering one of the major surfaces of the lengthwise portion of the sheet substrate dipped in the electrolytic solution while moving together with the sheet substrate.

According to the present invention, there is also provided a process for forming a zinc oxide film on a sheet substrate, comprising:

providing a tank containing an aqueous electrolytic solution containing at least nitrate ions and zinc ions, continuously feeding and conveying an elongated electroconductive sheet substrate having two major surfaces in a direction by conveyer means while dipping a lengthwise portion of the sheet substrate in the electrolytic solution, immersing a counter electrode in the electrolytic solution so as to be opposite to the lengthwise portion of the sheet substrate, and disposing a power supply so as to pass a current between the sheet substrate and the counter electrode, wherein the conveyer means include a plurality of rollers and an endless belt wound about the rollers so as to have a conveyer surface contacting and covering one of the major surfaces of the lengthwise portion of the sheet substrate dipped in the electrolytic solution while moving together with the sheet substrate.

According to the present invention, there is further provided a process for producing a photo-electricity generating device comprising the steps of:

forming a zinc oxide film on a sheet substrate comprising: providing a tank containing an aqueous electrolytic solution containing at least nitrate ions and zinc ions; continuously feeding and conveying an elongated electroconductive sheet substrate having two major surfaces in a direction by conveyer means while dipping a lengthwise portion of the sheet substrate in the electrolytic solution; immersing a counter electrode in the electrolytic solution so as to be opposite to the lengthwise portion of the sheet substrate; and disposing a power supply so as to pass a current between the sheet substrate and the counter electrode, wherein the conveyer means include a plurality of rollers and an endless belt wound about the rollers so as to have a conveyer surface contacting and covering one of the major surfaces of the lengthwise portion of the sheet substrate dipped in the electrolytic solution while moving together with the sheet substrate; and forming an semiconductor layer on the zinc oxide film.

By using the above apparatus and processes wherein one of major surfaces (i.e., the back side where overlying layers are not formed) of the lengthwise portion of the electroconductive sheet substrate is covered by the endless belt in the aqueous-electrolytic solution, it is possible to prevent the electrodeposition or formation of the zinc oxide film on the back-side of the electroconductive sheet substrate without applying an insulating film or sheet for suppressing the formation of the zinc oxide film into the back side of the sheet substrate, thus omitting steps of application and peeling-off of the insulating film to reduce (halve) a current density required for the electrodeposition.

In the present invention, the endless belt and one major surface of the lengthwise direction of the electroconductive sheet substrate are kept in a contact state in the aqueous-electrolytic solution so as to prevent the electrodeposition of the zinc oxide film on the major surface.

However, the aqueous-electrolytic solution, the major surface may have a portion not in contact with the endless belt but contacting the aqueous-electrolytic solution directly if the portion is apart from the counter electrode to the extent that the portion is substantially not affected by the electrodeposition action.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
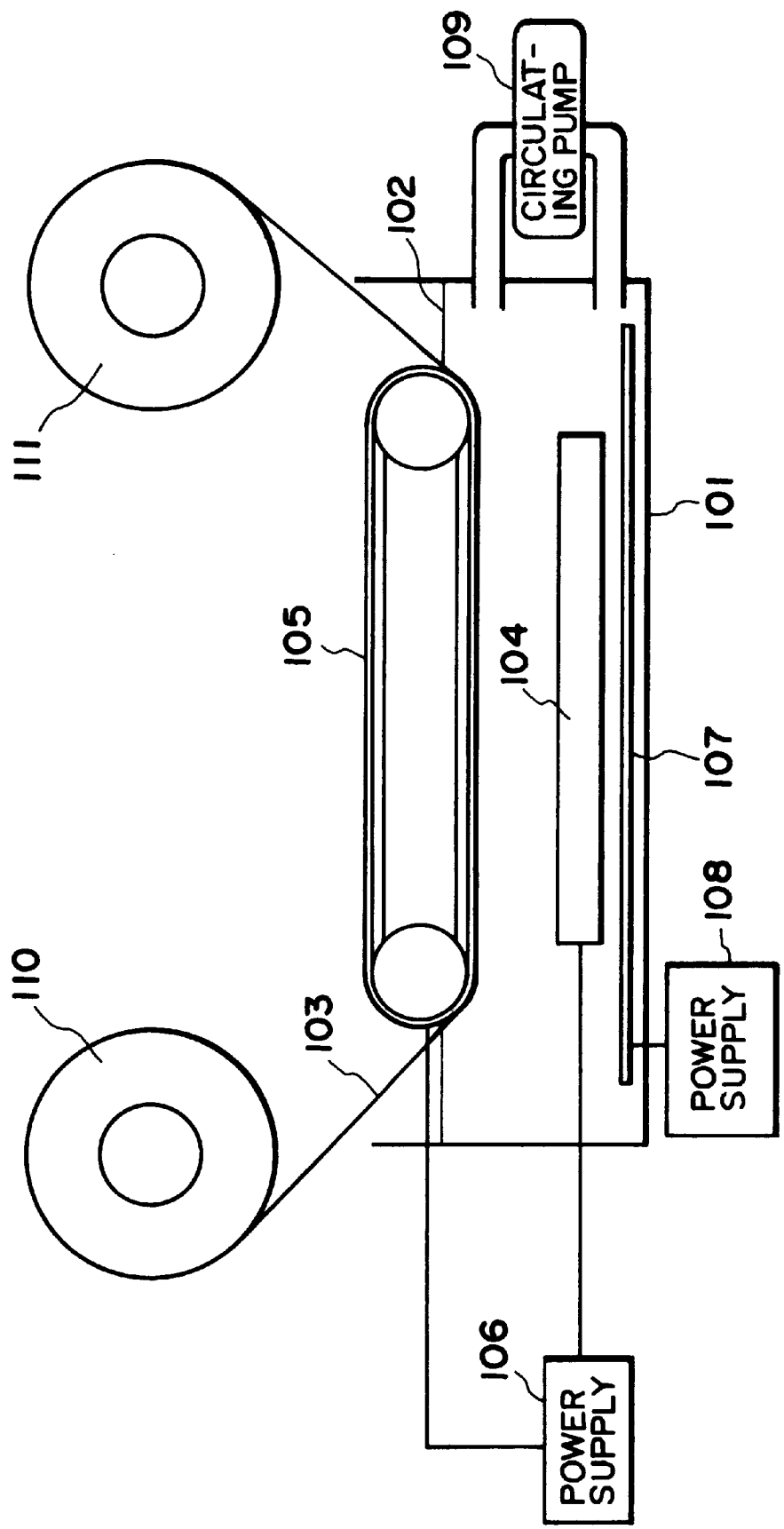
FIGS. 1, 3, 4 and 5 are respectively a schematic sectional view showing an embodiment of an apparatus for forming a zinc oxide film on a sheet substrate according to the present invention.

FIG. 1 is a schematic sectional view of an embodiment of an apparatus for forming a zinc oxide film on an electroconductive sheet substrate in an elongated shape according to the present invention.

Referring to FIG. 1, the apparatus includes an electrolytic tank 101 for holding therein an electrolytic solution, an aqueous electrolytic solution 102 containing at least nitrate ions and zinc ions (e.g., an aqueous zinc nitrate solution), an elongated electroconductive sheet substrate 103, counter electrode 104 of, e.g., zinc, a endless belt 105 wound about plural rollers and a power supply 106.

The aqueous electrolytic solution 102 is contained in the tank 101 at a prescribed concentration and circulated by a circulating pump (circulating device) 109 while being heated by a heater 107 connected to a power supply 106 for the heater 107.

The electroconductive sheet substrate 103 is conveyed in the aqueous electrolytic solution 102 from a feed or delivery roller 110 for feeding the substrate 103 and then is conveyed and wound up by a take-up (wind-up) roller 111.

The power supply 106 is connected with the endless belt 105 and the counter electrode 104 in this embodiment but may be connected with the electroconductive sheet substrate 103. Particularly, when the endless belt 105 comprises an insulating material, the electroconductive sheet substrate 103 and the counter electrode 104 are connected with the power supply 106. Each of the endless belt 105 and the electroconductive sheet substrate 103 may be grounded.

Figure 2:
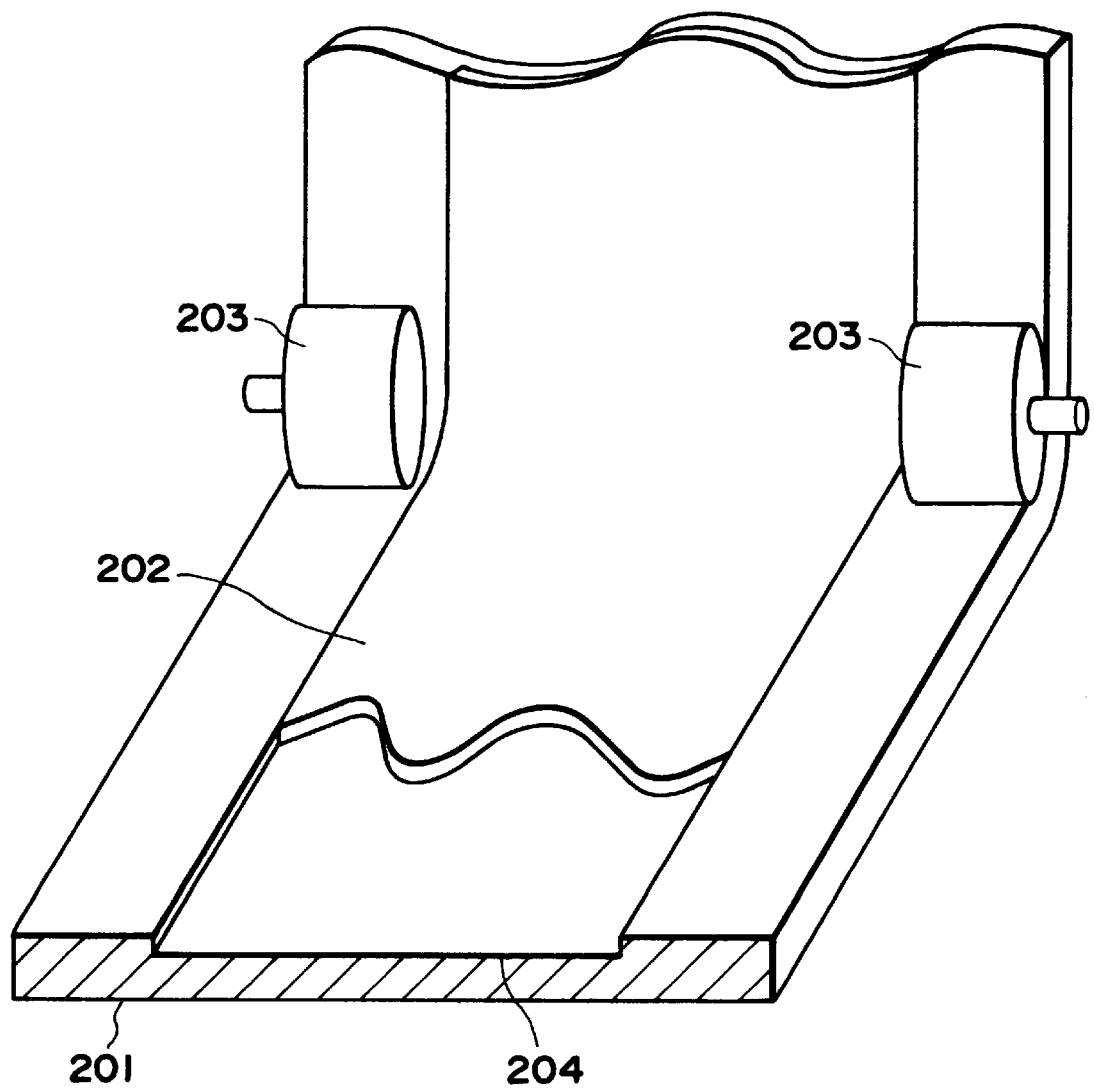
FIG. 2 is a schematic perspective view of an embodiment of an endless belt constituting the film-forming apparatus of the present invention.

FIG. 2 is an enlarged perspective view of an embodiment of an endless belt 201 for conveying an elongated electroconductive sheet substrate 202.

Referring to FIG. 2, the endless belt 201 has a recess portion 204 for fitting the electroconductive sheet substrate 202 at a central portion thereof an is provided with two edge-supporting rollers 203 (as conveyance rollers) at lateral edge portions thereof.

The endless belt 201 may generally comprise a ferromagnetic material and magnetically adsorbs or attracts the elongated electroconductive sheet substrate 202, thus conveying the electroconductive sheet substrate 202 in synchronism with the movement of the endless belt 201. The electroconductive sheet substrate 202 may be conveyed by frictional force caused by pressing the electroconductive sheet substrate 202 against the surface of the endless belt 201, which is floatable in the electrolytic solution, instead of the use of magnetic force.

By using the above endless belt 201, it is possible to form the zinc oxide film on only one of opposite surfaces (upper and lower surfaces) of the electroconductive sheet substrate 202.

Further, by the use of the edge-supporting rollers 203 contacting only the edge portions of the endless belt 201, the conveyance (moving) direction of the electroconductive sheet substrate 202 can be changed without causing the contact between the conveyance rollers 203 and the film-forming surface of the electroconductive sheet substrate 202, thus preventing or minimizing an incorporation of impurities or contaminants into the zinc oxide film from the rollers 203. It is also possible to prevent peeling-off and breakage of the zinc oxide film formed on the electroconductive sheet substrate 202.

As a distance between the feed roller and the wind-up roller through the conveyance rollers becomes larger, a winding (positional) deviation of the electroconductive sheet substrate 202 at the wind-up roller is generally liable to occur.

However, in this embodiment, the endless belt 201 is provided with the central recess portion 204 where the electroconductive sheet substrate 202 is fitted in the recess portion 204 to expose a film-forming surface on an identical level with the edge portions of the endless belt 201, thus suppressing the winding deviation (positional shift) of the electroconductive sheet substrate 202 and not requiring a particular device or mechanism for prevention of the winding deviation.

A material suitably used for forming the endless belt 201 may include those excellent in a nitric acid-resistance and having a high flexibility and handling properties. Examples of such a material may include a material of a rubber selected from the group consisting of butadiene rubber, styrene rubber, butyl rubber, ethylene-propylene rubber, nitrile rubber, silicone rubber and fluorine-containing rubber.

When the elongated electroconductive sheet substrate is used as the cathode (negative electrode) during the electrodeposition of the zinc oxide film on the electroconductive sheet substrate, portions contacting the electroconductive sheet substrate are inevitably negatively charged. As a result, the zinc oxide film is also electrodeposited on the surfaces of the conveyance devices (conveyer means) including the endless belt. Accordingly, each of the conveyance devices may preferably have a portion, comprising or coated with an insulating material, which is immersed in or contacts with the aqueous electrolytic solution.

The endless belt may preferably be formed by incorporating a powder magnet into the above-mentioned rubber material in order to provide a ferromagnetic endless belt.

Examples of the powder magnet may include permanent magnets providing a strong magnetic force and including: quench hardening magnets, such a carbon steel, tungsten steel, and KS steel; precipitation hardening magnets, such as Alnico 5 and Cunifel; magnetic field formation-type magnets, such as are earth cobalt magnets; and oxide magnets, such as OP magnet and Ferroxdure 2.

Further, by using a magnet of an insulating material, it is possible to minimize the formation of the zinc oxide film on the endless belt.

In the present invention, it is possible to suppress an adverse influence of a magnetic field caused by the ferromagnetic endless belt in a direction of an electric field between the electroconductive sheet substrate and the counter (zinc) electrode by magnetizing the endless belt in a direction perpendicular to a belt surface (conveyance surface) thereof contacting and holding the electroconductive sheet substrate. Further, another ferromagnetic member magnetized to have an opposite polarity may preferably be disposed opposite to the endless belt in the aqueous electrolytic solution or at the bottom of the tank, whereby a distribution of a magnetic field strength with respect to the electroconductive sheet substrate can be controlled so that the directions of magnetic lines of force curved and extend between one (surface) side of the endless belt and the other (back) side are regulated to be uniformly converted into those of straight magnetic lines of force parallel to each other between the electroconductive sheet substrate and the counter electrode. As a result, uniform electrodeposition is performed to remarkably improve a production yield, thus reducing production costs.

Figure 3:
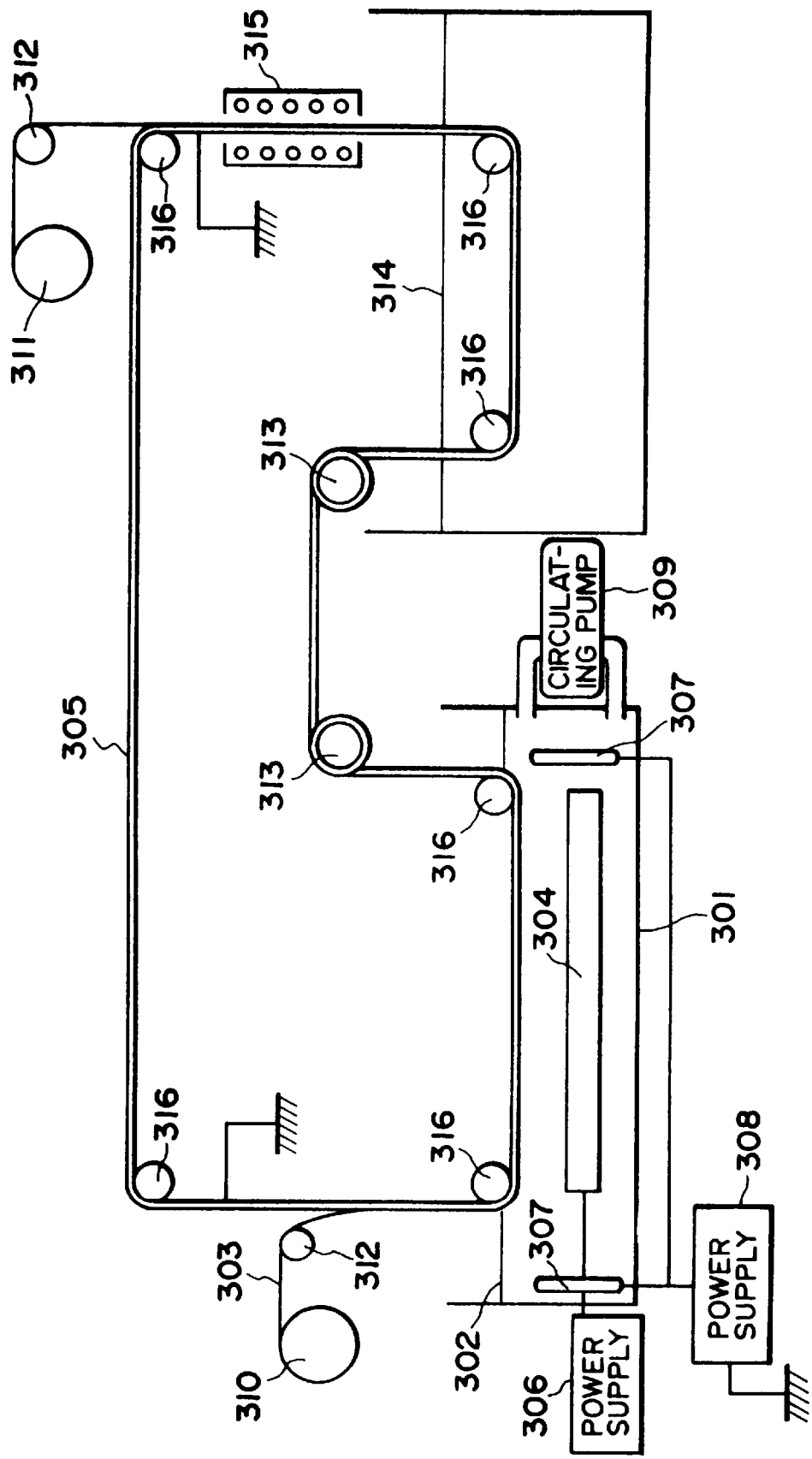

FIG. 3 is a schematic sectional view showing an embodiment of an apparatus for forming an zinc oxide film capable of continuously effecting washing and drying of the electroconductive sheet substrate after forming the zinc oxide film on the electroconductive sheet substrate.

Referring to FIG. 3, the continuous zinc oxide film-forming apparatus includes an electrolytic tank 301, an electrolytic solution (aqueous electrolytic solution) 302, an elongated electroconductive sheet substrate 303, a zinc, anode (counter electrode) 304, a ferromagnetic endless belt (cathode) 305 which is grounded, a power supply 306 connected to the zinc anode 304, heaters 307, a power supply 308 connected to the heaters 307, a circulating pump 309, a feed roller 310 for feeding the electroconductive sheet substrate 303, a wind-up roller 311 for winding up the electroconductive sheet substrate 303, electrode rollers 312, edge-supporting rollers 313, a washing tank 314, drying heaters (drying device) 315, and conveyance rollers 316.

After the zinc oxide is formed on the elongated electroconductive sheet substrate 303 in the electrolytic tank 301 by electrodeposition, the electroconductive sheet substrate 303 is washed with pure water in the washing tank 314 and dried by the drying heaters 315, followed by wind-up by the wind-up roller 311. The ferromagnetic endless belt 305 holding the electroconductive sheet substrate 303 is conveyed by the conveyance rollers 316 and supported by the edge-supporting rollers 313. The electroconductive sheet substrate 303 is fitted in the recess portion of the endless belt 305, whereby the formed zinc oxide film does not contact with the conveyance devices.

Figure 8:
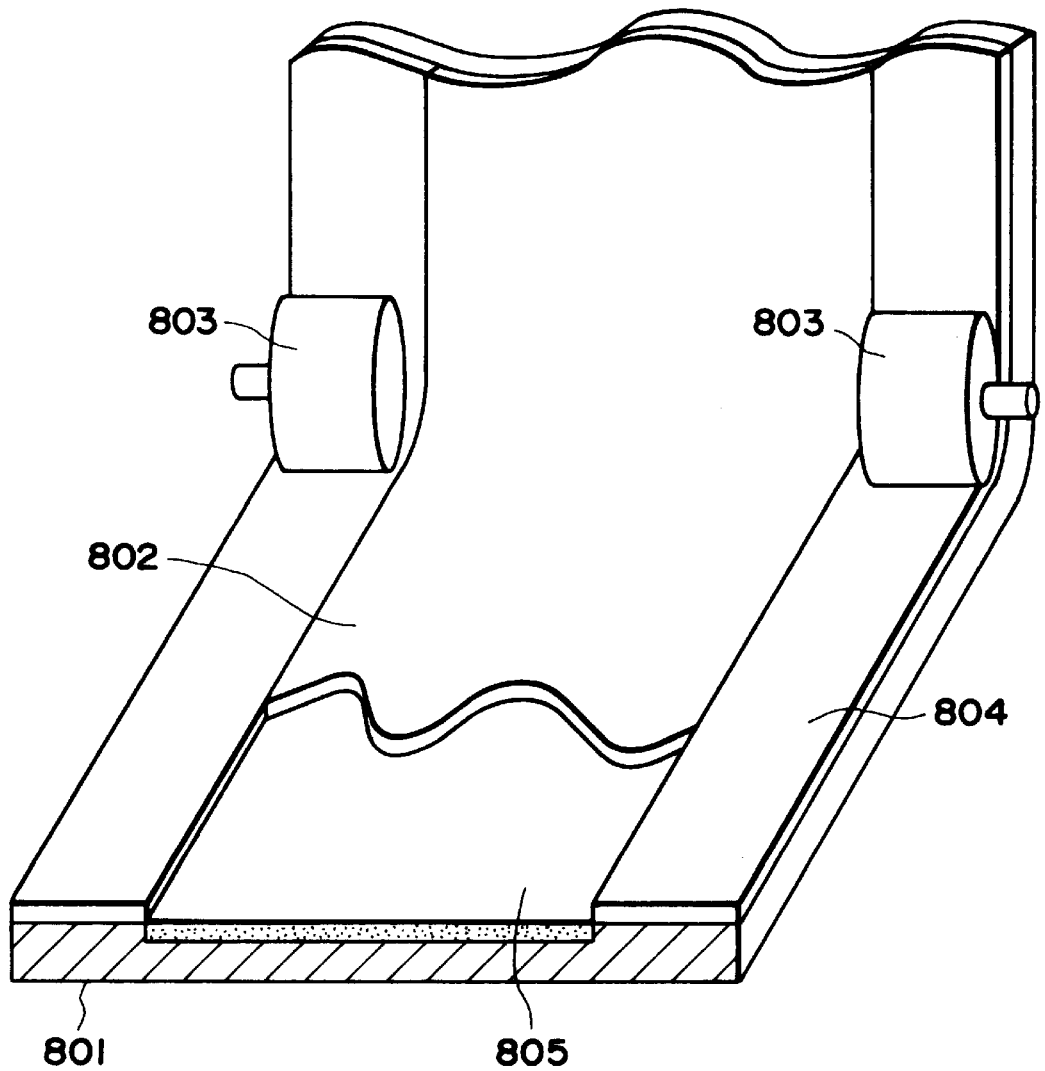
FIG. 8 is a schematic perspective view of an embodiment of an endless belt, provided with an auxiliary cathode portion, constituting the film-forming apparatus of the present invention.

FIG. 8 shows an embodiment of a ferromagnetic endless belt 801 provided with auxiliary cathodes 804.

Referring to FIG. 8, the endless belt 801 has a recess portion 805 for fitting therein an elongated electroconductive sheet substrate 802 at a central portion thereof. The endless belt 801 has opposite edge portions, sandwiching the recess portion 805, each comprising the auxiliary cathode 804 of an electroconductive material where the endless belt 801 is supported by an edge-supporting roller 803.

When the endless belt 801 is used in the apparatus shown in FIG. 1, the power supply 106 may be connected with the auxiliary cathode 804.

By using the electroconductive auxiliary cathode 804 sandwiching and contacting the electroconductive sheet substrate (cathode) 802 while applying a current to the auxiliary cathodes 804 and the electroconductive sheet substrate 802 during the electrodeposition, a local increase in current density at lateral ends of the electroconductive sheet substrate (in a width direction thereof) can effectively be minimized, thus uniformizing a current density distribution in the width direction of the electroconductive sheet substrate to ensure a uniform thickness of the formed zinc oxide film. The use of the auxiliary cathode can also suppress an anomalous growth of zinc oxide crystal particles, thus improving a production yield. Further, when the size of the auxiliary cathode is made small, it is possible to reduce a total amount of the current applied for the electrodeposition of the zinc oxide film.

The effects of the use of the auxiliary cathode will be specifically described based on the following Reference Examples 1 and 2.

REFERENCE EXAMPLE 1

A substrate of stainless steel (Stainless Steel 1430BA; 70×70 mm) (as an auxiliary cathode) having a central recess portion for fitting therein a particular substrate (50×50×0.12 mm) was provided.

As a cathode, a stainless steel substrate (Stainless Steel 430BA; 50×50×0.12 mm) was fitted in the recess portion of the above substrate so that the exposed surface of the cathode substrate (50×50 mm) and the surface of the auxiliary cathode substrate in a frame-like shape (width=10 mm) together form a uniform (leveled) surface.

As an anode (counter electrode), a zinc substrate (zinc substrate (purity=99.99%); 70×70×1 mm) was used.

Electrodeposition of a zinc oxide film was performed in an aqueous electrolytic solution of zinc nitrate (concentration=0.1 mol/l) containing saccharose in a proportion of 2 g/100 ml under the following conditions.

Current density: 3.5 mA/cm$^2$

Solution temperature: 85° C.

Current application time: 6 min.

The thus formed zinc oxide film was subjected to measurement of surface roughness with a surface-roughness meter to provide a graph showing a relationship between the sectional shape and thickness of the zinc oxide film.

Figure 7:
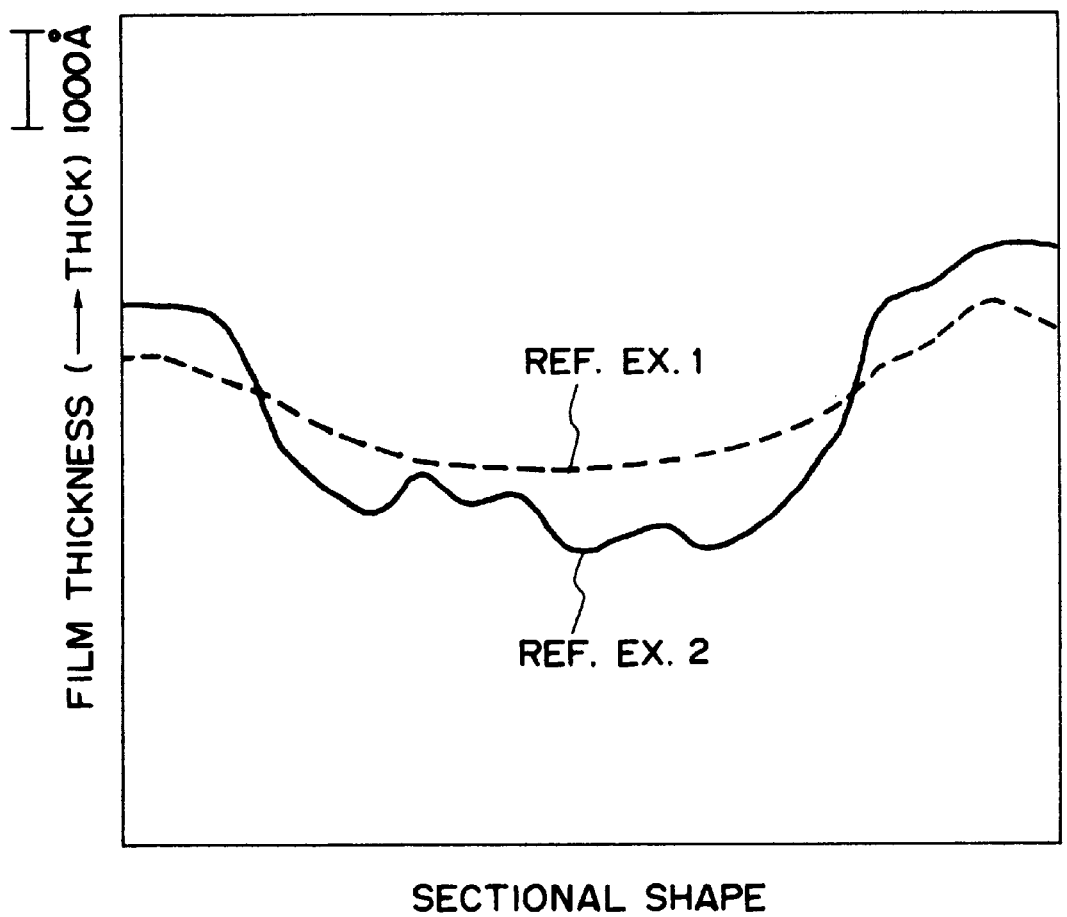
FIG. 7 is a graph for showing the effect of the use of an auxiliary cathode (electroconductive) portion.

The results are shown in FIG. 7.

REFERENCE EXAMPLE 2

A zinc oxide film was formed on a cathode substrate and observed in the same manner as a Reference Example 1 except that the auxiliary cathode substrate (70×70 mm) was not used and an insulating tape was applied to the entire back side of the cathode substrate (50×50×0.12 mm).

The results are shown in FIG. 7.

As apparent from FIG. 7, when the auxiliary cathode is not employed (Reference Example 2), the formed zinc oxide film has a thinner central portion and a thicker end portion since the film-forming (electrodeposition) rate is substantially proportional to the current density which is smallest at the central portion and is gradually increased at a portion toward the end portion.

On the other hand, when the auxiliary cathode is employed (Reference Example 1), the film thickness distribution of the zinc oxide film can be effectively minimized.

Accordingly, in the present invention, the auxiliary cathode may desirably be used in combination with the elongated electroconductive sheet substrate as the cathode in order to enlarge the area of the entire cathode region.

Hereinbelow, the process for forming an zinc oxide film according to the present invention will be described.

When a voltage is applied between a ferromagnetic an endless belt and a zinc anode (counter electrode) at a constant-current mode, an electric circuit is formed between the zinc anode and an elongated electroconductive sheet substrate (cathode) in intimate contact with the endless belt via an aqueous electrolytic solution (aqueous zinc nitrate solution), thus forming a transparent zinc oxide film on the surface of the electroconductive sheet substrate as the cathode by the electrodeposition.

The zinc oxide film is successively formed on the elongated electroconductive sheet substrate fed from the feed roller and wound up by the wind-up roller.

The aqueous zinc nitrate solution used in the present invention may preferably have an electrolyte concentration of 0.05–1.0 mol/l. Below 0.05 mol/l, the zinc oxide crystal is not deposited on the elongated electroconductive sheet substrate and (metallic) zinc crystal is deposited thereon in some cases. Above 1.0 mol/l, the anomalous growth is liable to be caused. When the zinc nitrate concentration is 0.05–1.0 mol/l, a position of the strongest peak in an X-ray diffraction pattern is shifted from a position (002) (at the concentration below 0.05 mol/l) to a position (001), whereby the surface shape of the zinc oxide film is correspondingly changed from a flat (smooth) state to an uneven state, thus being suitable for a light-confining layer for the photo-electricity generating device.

In the present invention, a current applied so as to pass through a gap between the electroconductive sheet substrate and a counter electrode may preferably have a current density of 10 mA/dm$^2$–10 A/dm$^2$. Below 10 mA/dm$^2$, the zinc oxide crystal is not readily deposited. Above 10 A/dm$^2$, the anomalous growth of the crystal is liable to occur.

The zinc oxide film may preferably be formed by electrodeposition at a temperature (of the aqueous solution) of at least 50° C., thus stably effecting a zinc oxide-forming reaction.

As a pretreatment for the electrodeposition, the electroconductive sheet substrate may preferably be heated to have a temperature which is within ±5° C. of the aqueous solution temperature, whereby the anomalous growth due to an irregularity in the surface temperature of the electroconductive sheet substrate immediately after the initiation of the electrodeposition operation can effectively be prevented, thus stably initiating a deposition reaction in liquid phase.

The aqueous electrolytic solution may preferably contain a carbohydrate since the carbohydrate generates hydrogen to function as a buffer suppressing an increase of a pH of the aqueous solution, thus stably controlling the zinc oxide-forming reaction to regulate a particle size of the zinc oxide crystal.

Examples of such a carbohydrate may include glucose, saccharose, cellulose and starch.

The electroconductive sheet substrate used in the present invention may comprises a single plate or sheet of an electroconductive material or a support coated with one or two or more films. The support may be electrically insulating as long as one surface thereof is electroconductive.

Examples of the electroconductive material may include: metals, such as Cu, Ni, Cr, Fe, Al, Mo, Nb, Ta, V, Ti and Rh; and alloys of these metals and alloys of the above metal(s) with other metals. These materials can be formed in a single plate or sheet. Among these materials, in view of a processability, strength, chemical stability and production costs, stainless steel and Fe may preferably be used as the material for the electroconductive sheet substrate.

Example of an insulating material for the support at least one of which surface is coated with the electroconductive material (as described above) may include glass; ceramics; and synthetic resins, such as polyester, polyethylene, polycarbonate, cellulose acetate, polypropylene, polyvinyl chloride, polyvinylidene chloride, polystyrene, and polyamide.

The elongated electroconductive sheet substrate may preferably be used in a form of a rolled or coiled sheet (or plate) wound about a cylindrical body (shaft).

In the case where the electroconductive sheet substrate is formed by forming the metal layer on the (insulating) support, the metal layer may be formed by various processes including vacuum vapor deposition, sputtering, screen printing, dipping, plasma chemical vapor deposition (plasma CVD), electrodeposition and electroless deposition. It is also possible to adopt the above-mentioned electrodeposition plural times.

The sheet substrate may be provided with a surface unevenness by etching the sheet substrate surface with an acid solution (etchant), such as $HNO_3$, HF, HCl, $H_2SO_4$. The surface unevenness of the electroconductive sheet substrate may preferably be at most 3 μm in terms of a center-line average roughness (Ra).

In the case where the elongated electroconductive sheet substrate is required to have a flexibility or softness, the electroconductive sheet substrate may be made thin as long as the resultant electroconductive sheet substrate can sufficiently exhibit a function as the support. Generally, the thickness of the electroconductive sheet substrate is set to be at least 10 μm in view of productivity, handling properties and mechanical strength of the resultant electroconductive sheet substrate.

The surface of the sheet substrate may desirably be washed or cleaned with a surfactant or other organic substances in order to prevent peeling-off of its overlying layers (e.g., backside reflection layer and zinc oxide layer).

The electroconductive sheet substrate used in the present invention may be coated with a metal layer on the surface thereof. The metal layer functions as a backside reflection layer when the above-mentioned zinc oxide layer is used for constituting the photo-electricity generating device.

The backside reflection layer may preferably be formed in a single layer or plural layers each comprising a metal, such as Au, Ag, Cu or Al, showing high reflectance and electroconductivity.

The backside reflection layer may preferably be formed in a thickness (total thickness for the plural layer-type including an intermediate layer described below) of 0.05–0.5 $\mu$m. Below 0.05 $\mu$m, a resultant reflectance is undesirable decreased. Above 0.5 $\mu$m, the formation of such a layer becomes expensive.

The backside reflection layer may preferably be formed through a vacuum vapor deposition process, a sputtering process or an electroplating process (an electrochemical deposition process in an aqueous solution).

The backside reflection layer may have a flat (smooth) surface or an uneven surface. When the backside reflection layer is formed by sputtering at a substrate temperature of at least 150° C., the resultant backside reflection layer is provided with a surface unevenness, thus improving adhesive properties between the backside reflection layer and the sheet substrate.

When an aluminum (Al) layer is used as the backside reflection layer, it is difficult to directly deposit the zinc oxide layer on the Al layer by an electrochemical process (electroplating).

Accordingly, an intermediate layer showing transparency and electroconductivity may preferably be formed on the backside reflection layer.

Figure 6:
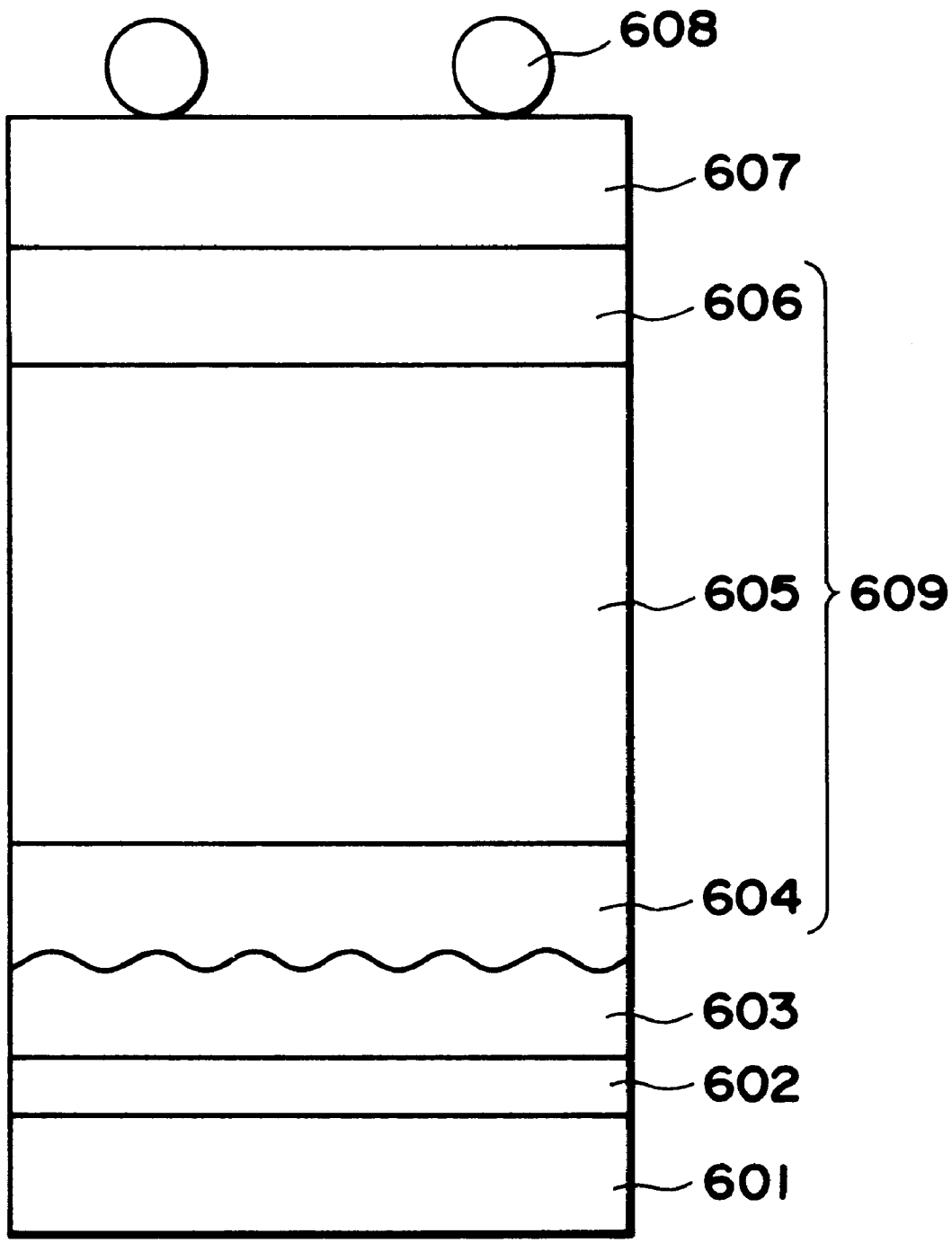
FIG. 6 is a schematic sectional view of an embodiment of a photo-electricity generating device including the zinc oxide film formed by the apparatus (and/or process) according to the present invention.

FIG. 6 shows an embodiment of a photo-electricity generating device including the zinc oxide film formed by the process according to the present invention.

Referring to FIG. 6, the photo-electricity generating device includes a support 601, a metal layer 602, a zinc oxide layer 603 (formed by the above-mentioned process), a semiconductor layer 609 comprising three layers of an n-type layer 604; i-type layer 605 and p-type layer 606, a transparent electroconductive layer (transparent electrode) 607, and a collector (grid) electrode 608.

The semiconductor layer 609 formed on the zinc oxide layer may be of pn junction-type, pin junction-type, Shottky junction-type and heterojunction-type. Examples of a material for the semiconductor layer may include amorphous (a-)silicon hydride, amorphous silicon germanium hydride, amorphous silicon carbide hydride, microcrystalline ($\mu$c-) silicon and polycrystalline silicon. The material for the semiconductor layer may preferably comprise a non-single crystalline semiconductor.

Particularly, amorphous or microcrystalline Si, C, Ge or alloys thereof may suitable be used as the material for the semiconductor layer successively formed on the zinc oxide layer on the elongated electroconductive sheet substrate when the continuous process is used. These materials may also preferably contain hydrogen and/or halogen in an amount of 0.1–40 atomic %, and may further include oxygen atom and/or nitrogen atom at a concentration of at most $5 \times 10^9$ atom.cm$^{-3}$.

Further, in order to provide a p-type semiconductor layer and an n-type semiconductor layer, Group III elements and Group V elements may be added in the semiconductor layers 606 and 604, respectively.

When the photo-electricity generating device has a stacked cell structure comprising plural semiconductor layers each including pin junction, an i-type constituting layer of the pin junction-type semiconductor layer closer to the side through which incident light passes may preferably have a broader band gap and a constituent layer may preferably have a narrower band gap with an increasing distance from the incident side of light. Further, within the respective i-type layer, a portion closer to the adjacent p-type layer may preferably have a minimum of the band gap compared with a central portion.

The doping layer (p-type layer or n-type layer) on the incident side of light may preferably be made of a crystalline semiconductor showing less light absorption or a semiconductor having a broader band gap.

The semiconductor layer 609 may generally be formed through processes including microwave plasma chemical vapor deposition (MW plasma CVD), very high frequency plasma chemical vapor deposition (VHF plasma CVD), radio frequency plasma chemical vapor deposition (RF plasma CVD).

Gases (principal gases) suitable for deposition of amorphous semiconductor layer of Group IV elements and alloys of Group IV elements may principally comprise: silicon-containing compounds capable of being gasified, such as $SiH_4$ and $Si_2H_6$; and germanium-containing compound capable of being gasified, such as $GeH_4$. Further, these gases may optionally comprise compounds which contain carbon, nitrogen and/or oxygen and which can be gasified.

As a dopant gas for forming a p-type layer, $B_2H_6$ and $BF_3$ may generally be used. Further, $PH_3$ and $PF_3$ may generally be used as a dopant gas for forming an n-type layer.

Particularly, when the microcrystalline semiconductor layer, the polycrystalline semiconductor layer or an semiconductor layer, such as an SiC layer, having a low light absorption property or a broader band gap is deposited on the zinc oxide layer, the semiconductor layer is formed by using an MW power, VHF power or RF power providing a relatively high power value while increasing a dilution degree of the principal gas with hydrogen gas.

The transparent electrode (electroconductive layer) 607 (shown in FIG. 6) may be formed in an appropriate thickness, thus also functioning as a reflection-preventing layer.

The transparent electrode 607 may generally be formed by using a material, such as ITO (indium tin oxide), ZnO or $InO_3$, through vapor deposition, CVD, spray coating, spinner coating or dip coating.

The transparent electrode 607 may further contain a substance for changing (controlling) an electroconductivity.

The collector (grid) electrode 608 is formed for improving a charge (or current)-collection efficiency. The collector electrode 608 may generally be formed by processes including one wherein a metal electrode pattern is formed by sputtering with a mask; a printing process with an electroconductive paste or solder paste; and one wherein a metal wire is fixed by using an electroconductive paste.

The photo-electricity generating device produced by the process according to the present invention may be covered with protective layers at both sides thereof. In this case, reinforcing members, such as steel sheet or plate, may be used in combination with the protective layers.

Hereinbelow, the present invention will be described more specifically based on Examples.

EXAMPLE 1 AND COMPARATIVE EXAMPLE 1

EXAMPLE 1

Figure 5:
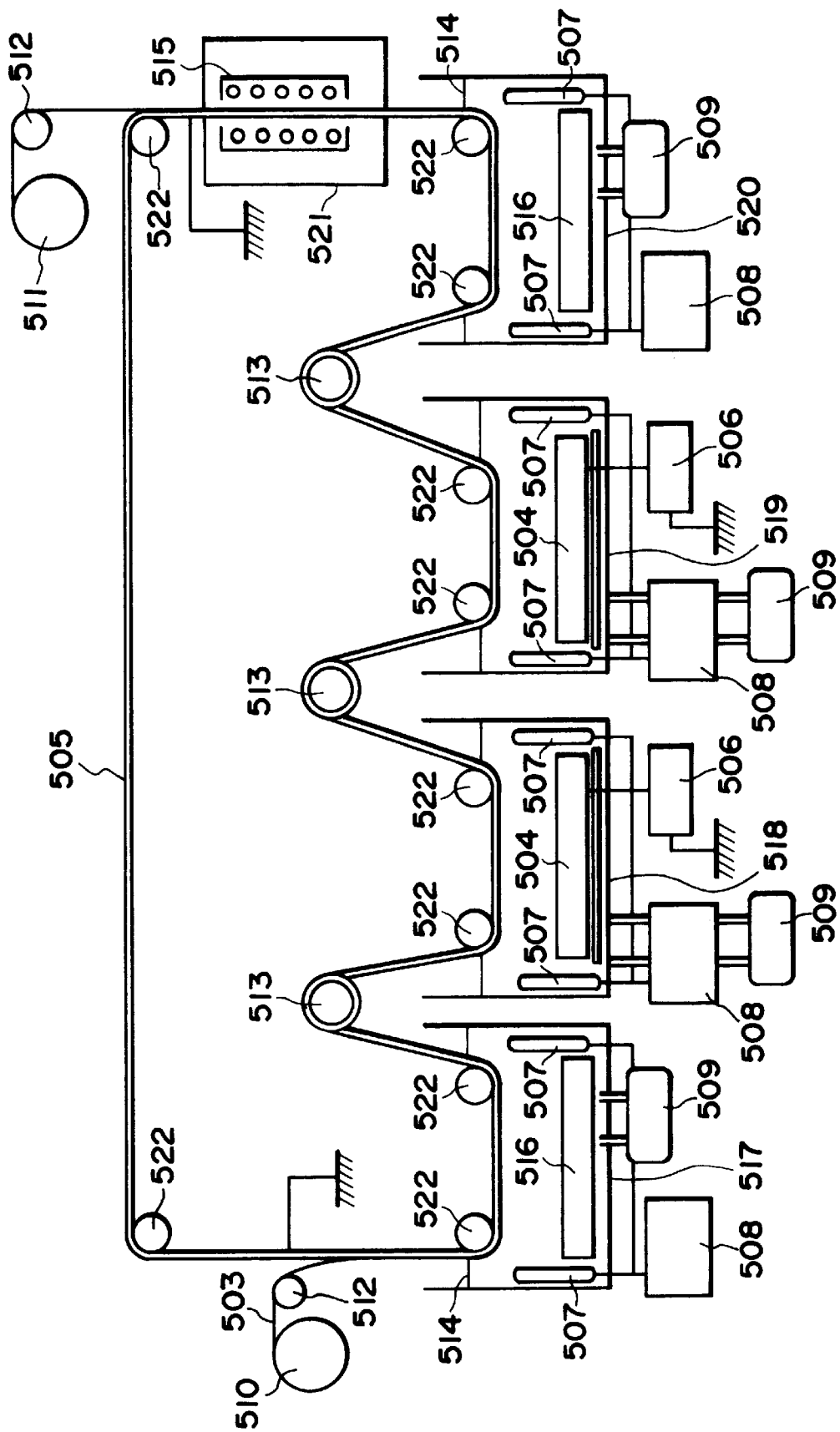

A 1.5 $\mu$m-thick zinc oxide film was formed on an elongated electroconductive sheet substrate 503 of a stainless steel sheet (SUS 430BA; 12 cm (width) ×500 m (length)× 0.15 mm (thickness)) by using a continuous film-forming apparatus shown in FIG. 5.

Referring to FIG. 5, the apparatus included the elongated electroconductive sheet substrate 503 (cathode), zinc anodes 504 (counter electrode), a ferromagnetic endless belt 505 comprising butadiene rubber as a main component, constant-current (power) supplies 506 for providing a prescribed current density, heaters 507, power supplies 508 for the heaters 507, circulating pumps 509, a feed (delivery) roller 510, a wind-up (take-up) roller 511, electrode rollers 512, edge-supporting rollers 513, washing liquids 514 of pure water, drying heaters 515, ultrasonic vibrating members 516, a first washing tank 517, a first electrodeposition tank 518, a second electrodeposition tank 519, a second washing tank 520, a drying chamber 521, and conveyance rollers 522.

The endless belt 505 had a recess portion in which the electroconductive sheet substrate 503 was fitted to provide a uniform (leveled) surface together with end portions of the endless belt 505 sandwiching the sheet substrate 503.

The electroconductive sheet substrate 503 had been preliminarily coated with a 8000 Å-thick Ag layer by sputtering and the zinc oxide layer was formed on the Ag layer.

The respective tank 517–520 contained appropriate liquids, respectively, and then the circulating pumps 509, the heaters 508 and the ultrasonic vibrating members 516 were actuated. The solution temperatures of the respective tanks 517–520 were controlled to be 85° C.

The electroconductive sheet substrate 503 was fed from the feed roller 510 and finally wound up by the wind-up roller 511 via the first washing tank 517, the first electrodeposition tank 518, the second electrodeposition tank 519, the second washing tank 520, and the drying chamber 521 in succession while being held in an intimate contact with the endless belt 505 conveyed by the conveyance rollers 522 and supported by the edge-supporting rollers 513.

The formation of the zinc oxide film was performed in the first and second electrodeposition tanks 518 and 519 under the conditions shown in Table 1.

TABLE 1

| Condition | 1st Electro-deposition tank | 2nd Electro-deposition tank |
| --- | --- | --- |
| Electrolytic solution | Aqueous zinc nitrate | Aqueous zinc nitrate |
| Concentration of zinc nitrate (mol/l) | 0.2 | 0.2 |
| Solution temp. (° C.) | 85 | 85 |
| Current density (mA/cm$^2$) | 8 | 5 |
| Saccharose content (g/l) | 50 | 45 |

After the formation the zinc oxide film on the elongated electroconductive sheet substrate 503 was terminated, the conveyance of the endless belt 505 was stopped and the constant-current power supplies 506, the heaters 507 and the ultrasonic vibrating members 516 were turned off.

Then, the rolled (coiled) electroconductive sheet substrate 503 having thereon the zinc oxide film was taken out from the apparatus.

COMPARATIVE EXAMPLE 1

A 1.5 μm-thick zinc oxide layer was formed in the same manner as in Example 1 except that the apparatus was changed to a sputtering apparatus according to a so-called Roll-to-Roll scheme as described in Comparative Example 7 of JP-A 9-8340.

Each of the zinc oxide films formed in Example 1 and Comparative Example 1 was subjected to measurement of reflectances based on regular (specular) reflection and irregular (diffuse) reflection.

As a result of the measurement, the zinc oxide film formed by the electrodeposition (Example 1) showed the regular reflectance being 1.03 times that of the zinc oxide film formed by the sputtering (Comparative Example 1) and the irregular reflectance being 1.08 times that of the zinc oxide film of Comparative Example 1.

Then, in order to evaluate adhesive properties of the zinc oxide film each of the zinc oxide films of Example 1 and Comparative Example 1 was left standing in a high-temperature and high-humidity environment (85° C., 85%RH) for 200 hours and in a normal-temperature and normal humidity environment (25° C., 40%RH) for 1 hour, followed by observation of the zinc oxide film.

As a result of the observation, the zinc oxide film of Comparative Example 1 was found to cause a partial peeling-off of the zinc oxide film but no peeling was observed with respect to the zinc oxide film of Example 1.

EXAMPLE 2 AND COMPARATIVE EXAMPLE 2

EXAMPLE 2

Figure 4:
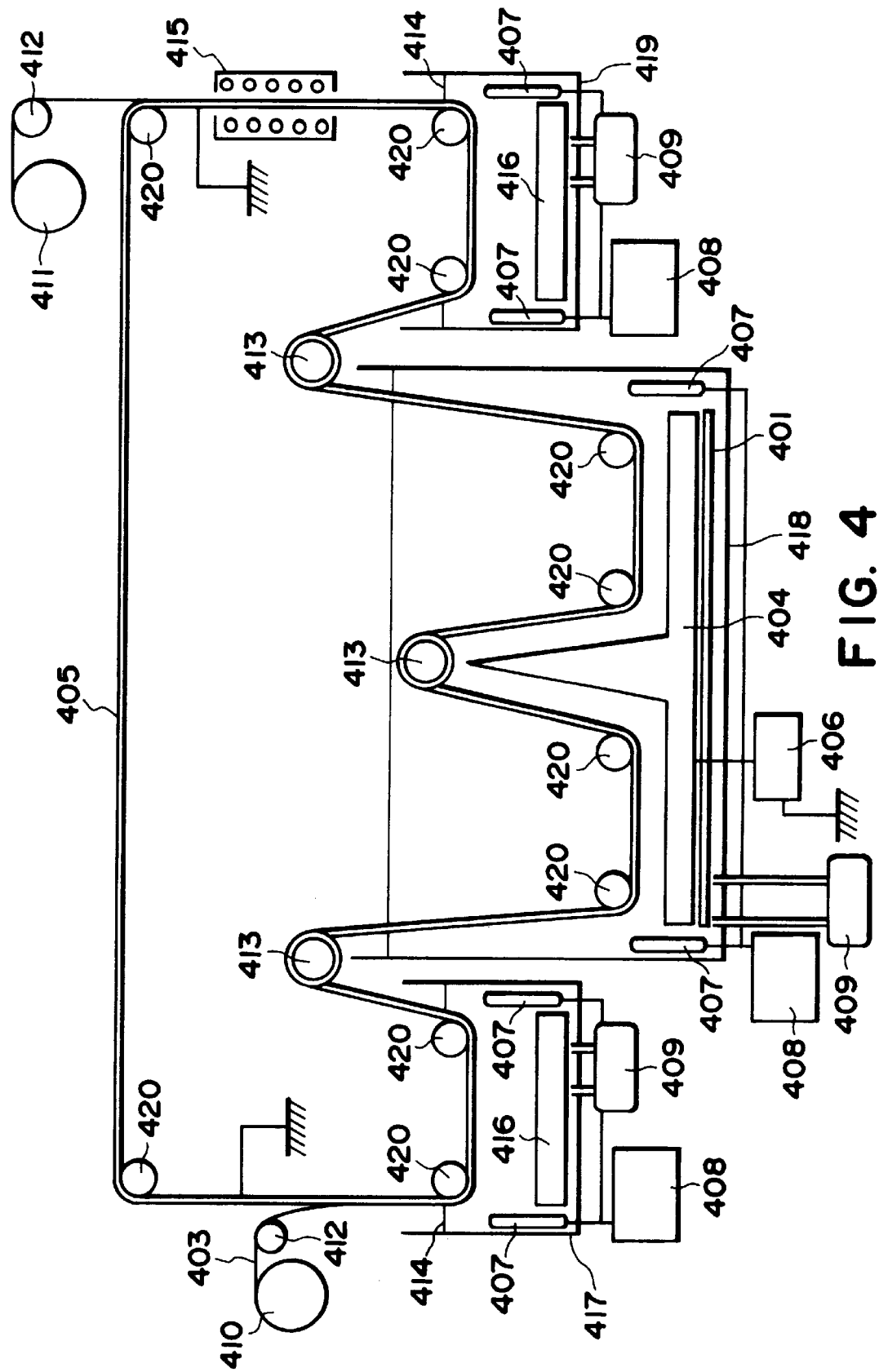

A 1.5 μm-thick zinc oxide film was formed on an elongated electroconductive sheet substrate 403 of a stainless steel sheet (SUS 430BA; 12 cm (width)×500 m (length)× 0.15 mm (thickness)) by using a continuous film-forming apparatus shown in FIG. 4 including a ferromagnetic endless belt 405 provided with auxiliary cathodes as shown in FIG. 8.

Referring to FIG. 4, the apparatus included a counter magnet 401, the elongated electroconductive sheet substrate 403 (cathode), 1 mm-thick zinc anodes of zinc sheet 404 (counter electrode; purity=99.99%), a ferromagnetic endless belt 405, a constant-current (power) supply 406 for providing a prescribed current density, heaters 407, power supplies 408 for the heaters 407, circulating pumps 409, a feed (delivery) roller 410, a wind-up (take-up) roller 411, electrode rollers 412, edge-supporting rollers 413, washing liquids 414, drying heaters 415, ultrasonic vibrating members 416, a first washing tank 417 for effecting washing with pure water, a first electrodeposition tank 418, a second washing tank 419 for effecting washing with pure water, and conveyance rollers 420.

The electroconductive sheet substrate 503 had been preliminarily coated with a 8000 Å-thick Ag layer by sputtering and the zinc oxide layer was formed on the Ag layer.

The electroconductive sheet substrate 403 was fed from the feed roller 410 an finally wound up by the wind-up roller 411 via the first washing tank 417, the first electrodeposition tank 418, the second washing tank 419 in succession while being held in an intimate contact with the endless belt 405 conveyed by the conveyance rollers 420 and supported by the edge-supporting rollers 413. In the electrodeposition tank 418, an aqueous-electrolytic solution of zinc nitrate was contained and was circulated by the circulating pump 409.

The formation of the zinc oxide film was performed in the electrodeposition tank 418 under the conditions shown in Table 2.

TABLE 2

| Condition | Electrodeposition tank |
| --- | --- |
| Electrolytic solution | Aqueous zinc nitrate solution |
| Concentration of zinc nitrate (mol/l) | 0.2 |
| Solution temp. (° C.) | 80 |
| Current density (mA/cm$^2$) | 7.5 |
| Saccharose content (g/l) | 50 |

COMPARATIVE EXAMPLE 2

A 1.5 μm-thick zinc oxide layer was formed in the same manner as in Example 2 except that the ferromagnetic endless belt 405 was omitted and an amount of a total current applied was set to be two times that for Example 2 while keeping a current density identical to that for Example 2 since the electroconductive sheet substrate 403 was not covered on the back side thereof.

Each of the zinc oxide films formed in Example 2 and Comparative Example 2 was subjected to measurement of reflectances based on regular (specular) reflection and irregular (diffuse) reflection.

As a result of the measurement, the zinc oxide film formed by the electrodeposition (Example 2) showed the regular reflectance being 1.05 times that of the zinc oxide film formed without using the endless belt 405 (Comparative Example 2) and the irregular reflectance being 1.11 times that of the zinc oxide film of Comparative Example 2.

EXAMPLE 3

A 1.5 μm-thick zinc oxide film was formed and evaluated in the same manner as in Example 1 except that auxiliary cathodes were provided to the ferromagnetic endless belt 505 (as shown in FIG. 8).

The thus formed zinc oxide film was found to show higher regular and irregular reflectances (1.08 times and 1.14 times those for Comparative Example 1, respectively) at both a central portion and end portion in a width direction and also show excellent adhesive properties similarly as in Example 1.

These excellent performances of the zinc oxide film were not changed with respect to other measuring points (50 m, 200 m and 500 m from the film-formation (electrodeposition) initiation point in a length direction).

At the measuring points, the thicknesses of the zinc oxide film were not fluctuated (c.a. 1.5 μm), thus showing a uniformity of film formation.

EXAMPLE 4 AND COMPARATIVE EXAMPLE 4

EXAMPLE 4

On the zinc oxide film formed in Example 1, a semiconductor layer comprising a pin triple cell structure including 9 layers in the following order shown below was formed by a CVD process.
<Semiconductor layer>

150 Å-thick 1st dope layer of n-type a-Si:H:P
700 Å-thick 1st i-layer of i-type a-SiGe:H
75 Å-thick 2nd dope layer of p-type μc-Si:H:B
75 Å-thick 3rd dope layer of n-type a-Si:H:P
600 Å-thick 2nd i-layer of i-type a-Si:Ge:H
75 Å-thick 4th dope layer of p-type μc-Si:H:B
75 Å-thick 5th dope layer of n-type a-Si:H:P
1000 Å-thick 3rd i-layer of i-type a-SiGe:H
75 Å-thick 6th dope layer of p-type μc-Si:H:B On the semiconductor layer thus formed, a 600 Å-thick transparent electrode layer of indium tin oxide (ITO) was formed and thereon, a collector (grid) electrode comprising a composite of Cu wire/Ag/C was formed, thus preparing a photo-electricity generating device (solar cell) having a structure identical to that shown in FIG. 6 except that the above semiconductor layer was used.

COMPARATIVE EXAMPLE 3

A photo-electricity generating device was prepared in the same manner as in Example 4 except that the zinc oxide film of Example 1 was changed to that of Comparative Example 1.

Each of the thus prepared photo-electricity generating devices of Example 4 and Comparative Example 3 was subjected to measurement of a photoelectric conversion efficiency and short circuit current at 25° C. by using a solar simulator (air mass (AM)=1.5; 100 mW/cm$^2$).

As a result of the measurement, the photo-electricity generating device of Example 4 was found to provide the photoelectric conversion efficiency being 1.14 times that of the photo-electricity generating device of Comparative Example 3 and the short circuit current being 1.17 times that of the photo-electricity generating device of Comparative Example 3.

When these photo-electricity generating devices (of Example 4 and Comparative Example 3) were exposed to light for 1000 hours (exposure test) by using the above solar simulator (AM=1.5; 100 mW/cm$^2$; surface temperature=50° C.), both the photo-electricity generating devices did not cause appearance failure (irregularity).

Thereafter, each of the these photo-electricity generating devices was subjected to measurement of photoelectric conversion efficiency and short circuit current in the above-described manner to obtain a ratio of those after the exposure test to those before the exposure test.

As a result, the ratios of the photoelectric conversion efficiencies (after the test/before the test) of the photo-electricity generating devices of Example 4 and Comparative Example 3 were comparable.

On the other hand, the ratio of the short circuit currents of the photo-electricity generating device of Example 4 was 0.83 and that of the photo-electricity generating device of Comparative Example 3 was 0.80.

As apparent from the above results, the photo-electricity generating device produced through the process according to the present invention was found to show excellent performances compared with that produced through the conventional process.

As described hereinabove, according to the apparatus and processes of the present invention, the film formation of the zinc oxide film on only one side of the elongated electroconductive sheet substrate can readily be performed by electrodeposition without using a particular means or step, thus allowing a reduction of production costs. Further, it is also possible to suppress a positional deviation (lateral shift) of the elongated electroconductive sheet substrate during the conveyance of the electroconductive sheet substrate.

The photo-electricity generating device produced through the process of the present invention is excellent in photoelectric properties (high photoelectric conversion efficiency and short circuit current) compared with that produced through the conventional process including the continuous sputtering process for the formation of the zinc oxide film.

What is claimed is:

1. An apparatus for forming a zinc oxide film on a sheet substrate, comprising:

a tank adapted to contain an aqueous electrolytic solution containing at least nitrate ions and zinc ions, conveyer means for continuously feeding and conveying an elongated electroconductive sheet substrate having two major surfaces in a direction while dipping a lengthwise portion of the sheet substrate in the electrolytic solution, a counter electrode adapted to be immersed in the electrolytic solution so as to be opposite to the lengthwise portion of the sheet substrate, and a power supply disposed so as to pass a current between the sheet substrate and the counter electrode, wherein said conveyer means include a plurality of rollers and an endless belt wound about the rollers so as to form a conveying path for said sheet substrate and including a conveyer surface adapted for contacting and adapted for covering one of the major surfaces of the lengthwise portion of the sheet substrate to be dipped in the electrolytic solution while moving together with the sheet substrate, wherein the sheet substrate is substantially longer than the conveying path for said sheet substrate.

2. An apparatus according to claim 1, wherein said endless belt comprises a magnetic material.

3. An apparatus according to claim 2, which further includes a magnetic member disposed opposite to said endless belt in the tank adapted to contain the aqueous electrolytic solution.

4. An apparatus according to claim 2, wherein said endless belt is magnetized in a direction perpendicular to the conveyer surface thereof.

5. An apparatus according to claim 1, wherein said endless belt has at least an electroconductive portion which is located at the conveyer surface and is supplied with the current together with the sheet substrate.

6. An apparatus according to claim 1, including a tank adapted to contain a washing liquid for receiving the endless belt spaced upstream or downstream from said tank adapted to contain said aqueous electrolytic solution.

7. An apparatus according to claim 1, wherein the tank is provided in a plurality of tanks each adapted to contain an aqueous electrolytic solution through which said endless belt passes.

8. An apparatus for forming a zinc oxide film on a sheet substrate comprising:

a tank adapted to contain an aqueous electrolytic solution containing at least nitrate ions and zinc ions, conveyer means for continuously feeding and conveying an elongated electroconductive sheet substrate having two major surfaces in a direction while dipping a lengthwise portion of the sheet substrate in the electrolytic solution, a counter electrode adapted to be immersed in the electrolytic solution so as to be opposite to the lengthwise portion of the sheet substrate, and a power supply disposed so as to pass a current between the sheet substrate and the counter electrode, wherein said conveyer means include a plurality of rollers and an endless belt wound about the rollers so as to have a conveyer surface adapted for contacting and adapted for covering one of the major surfaces of the lengthwise electrolytic solution while moving together with the sheet substrate and wherein said endless belt comprises a rubber and the magnetic material dispersed in the rubber is selected from the group consisting of butadiene rubber, styrene rubber, butyl rubber, ethylene propylene rubber, nitrile rubber, silicone rubber, and fluorine-containing rubber.

9. An apparatus for forming a zinc oxide film on a sheet substrate comprising:

a tank adapted to contain an aqueous electrolytic solution containing at least nitrate ions and zinc ions, conveyer means for continuously feeding and conveying an elongated electroconductive sheet substrate having two major surfaces in a direction while dipping a lengthwise portion of the sheet substrate in the electrolytic solution, a counter electrode adapted to be immersed in the electrolytic solution so as to be opposite to the lengthwise portion of the sheet substrate, and a power supply disposed so as to pass a current between the sheet substrate and the counter electrode, wherein said conveyer means include a plurality of rollers and an endless belt wound about the rollers so as to have a conveyer surface adapted for contacting and adapted for covering one of the major surfaces of the lengthwise portion of the sheet substrate to be dipped in the electrolytic solution while moving together with the sheet substrate and wherein said endless belt has a recess portion for fitting therein the electroconductive sheet substrate.

10. A process for forming a zinc oxide film on a sheet substrate, comprising:

providing a tank containing an aqueous electrolytic solution containing at least nitrate ions and zinc ions, continuously feeding and conveying an elongated electroconductive sheet substrate having two major surfaces in a direction by conveyor means while dipping a lengthwise portion of the sheet substrate in the electrolytic solution, immersing a counter electrode in the electrolytic solution so as to be opposite to the lengthwise portion of the sheet substrate, and disposing a power supply so as to pass a current between the sheet substrate and the counter electrode, wherein said conveyer means include a plurality of rollers and an endless belt wound about the rollers so as to form a conveying path for said sheet substrate and including a conveyer surface contacting and covering one of the major surfaces of the lengthwise portion of the sheet substrate dipped in the electrolytic solution while moving together with the sheet substrate, wherein the sheet substrate is substantially longer than the conveying path for said sheet substrate.

11. A process according to claim 10, wherein said endless belt comprises a magnetic material.

12. A process according to claim 11, which further includes a magnetic member disposed opposite to said endless belt in the tank containing the aqueous electrolytic solution.

13. A process according to claim 11, wherein said endless belt comprises a rubber and the magnetic material dispersed in the rubber selected from the group consisting of butadiene rubber, styrene rubber, butyl rubber, ethylene propylene rubber, nitrile rubber, silicone rubber, and fluorine-containing rubber.

14. A process according to claim 11, wherein said endless belt is magnetized in a direction perpendicular to the conveyer surface thereof.

15. A process according to claim 10, wherein said endless belt has a recess portion for fitting therein the electroconductive sheet substrate.

16. A process according to claim 10, wherein said endless belt has at least an electroconductive portion which is located at the conveyer surface and is supplied with the current together with the sheet substrate.

17. A process according to claim 10, wherein said endless belt passes through a washing liquid before and/or after passing through the aqueous electrolytic solution.

18. A process according to claim 10, wherein the tank is provided in a plurality of tanks each containing an aqueous electrolytic solution through which said endless belt passes.

19. A process according to claim 10, wherein said aqueous electrolytic solution further contains a carbohydrate.

20. A process for producing a photo-electricity generating device comprising the steps of:

providing a tank containing an aqueous electrolytic solution containing at least nitrate ions and zinc ions;

continuously feeding and conveying an elongated electroconductive sheet substrate having two major surfaces in a direction by conveyor means while dipping a lengthwise portion of the sheet substrate in the electrolytic solution;

immersing a counter electrode in the electrolytic solution so as to be opposite to the lengthwise portion of the sheet substrate; and disposing a power supply so as to pass a current between the sheet substrate and the counter electrode, wherein said conveyer means include a plurality of rollers and an endless belt wound about the rollers so as to form a conveying path for said sheet substrate and including a conveyer surface contacting and covering one of the major surfaces of the lengthwise portion of the sheet substrate dipped in the electrolytic solution while moving together with the sheet substrate, wherein the sheet substrate is substantially longer than the conveying path for said sheet substrate;

and forming a semiconductor layer on the zinc oxide film.

21. A process according to claim 20, wherein said endless belt comprises a magnetic material.

22. A process according to claim 21, which further includes a magnetic member disposed opposite to said endless belt in the tank containing the aqueous electrolytic solution.

23. A process according to claim 21, wherein said endless belt comprises a rubber and the magnetic material dispersed in the rubber selected from the group consisting of butadiene rubber, styrene rubber, butyl rubber, ethylene propylene rubber, nitrile rubber, silicone rubber, and fluorine-containing rubber.

24. A process according to claim 21, wherein said endless belt is magnetized in a direction perpendicular to the conveyer surface thereof.

25. A process according to claim 20, wherein said endless belt has a recess portion for fitting therein the electroconductive sheet substrate.

26. A process according to claim 20, wherein said endless belt has at least an electroconductive portion which is located at the conveyer surface and is supplied with the current together with the sheet substrate.

27. A process according to claim 20, wherein said endless belt passes through a washing liquid before and/or after passing through the aqueous electrolytic solution.

28. A process according to claim 20, wherein the tank is provided in a plurality of tanks each containing an aqueous electrolytic solution through which said endless belt passes.

29. A process according to claim 20, wherein said aqueous electrolytic solution further contains a carbohydrate.

30. A process according to claim 20, wherein said semiconductor layer comprises a non-single crystalline semiconductor.

* * * * *

UNITED STATES PATENT AND TRADEMARK OFFICE
CERTIFICATE OF CORRECTION

PATENT NO. : 6,077,411
APPLICATION NO. : 09/008560
DATED : June 20, 2000
INVENTOR(S) : Tetsuro Nakamura It is certified that error appears in the above-identified patent and that said Letters Patent is hereby corrected as shown below:

COLUMN 1

Line 9, "an" should read --a--;
Line 12, "there" should read --it--;
Line 13, "an" should read --a--;
Line 15, "a" should read --the--;
Line 16, "there" should read --it--;
Line 17, "an" should be deleted;
Line 18, "that" should read --so that--;
Line 20, "obtain an effect of" should be deleted;
Line 21, "suppressing an" should read --suppress--; and "an" should be deleted;
Line 22, "occurrence of" should be deleted;
Line 26, "reported" should read --reports--;
Line 27, "L53" should read --L53,--;
Line 34, "substrate. If" should read --substrate, if--;
Line 38, "can be" should read --are required.--;
Line 39, "obstructed." should be deleted;
Line 41, "requires an" should read --requires twice the--;
Line 42, "amount of a total" should be deleted; and "which is two times an amount" should be deleted;
Line 43, "thereof" should read --needed--;
Line 44, "substrate, thus being" should read --substrate. This is--;
Line 49, "of the methods for such a purpose" should read --prevention method--;
Line 52, "is accompanied with a" should read --has--; and
Line 53, "problem" should read --problems--; and "application" should read --applying--.

COLUMN 3

Line 1, "include" should read --includes--;
Line 17, "application" should read --applying--;
Line 18, "of" should be deleted; and "to reduce (halve) a" should read --and thereby reducing by half the--;
Line 25, "the" should read --in the--; and
Line 27, "but contacting" should read --but indirect contact with--; and "directly" should be deleted.

UNITED STATES PATENT AND TRADEMARK OFFICE
CERTIFICATE OF CORRECTION

PATENT NO. : 6,077,411
APPLICATION NO. : 09/008560
DATED : June 20, 2000
INVENTOR(S) : Tetsuro Nakamura It is certified that error appears in the above-identified patent and that said Letters Patent is hereby corrected as shown below:

COLUMN 4

Line 2, "a" should read --an--;
Line 26, "an" should read --and--;
Line 49, "an" should be deleted; and
Line 59, "IIowever," should read --However,--.

COLUMN 5

Line 2, "excellent in a" should read --with excellent--;
Line 25, "a" should read --as--;
Line 28, "are" should be deleted;
Line 52, "a" should be deleted; and
Line 63, "zinc," should read --zinc--.

COLUMN 6

Line 37, "uniformizing" should read --making--; and
Line 39, "strate" should read --strate uniform--.

COLUMN 7

Line 30, "IIereinbelow," should read --Hereinbelow,--;
Line 32, "an" should be deleted; and
Line 48, "the" should be deleted.

COLUMN 8

Line 11, "pII" should read --pH--;
Line 30, "Example" should read --Examples--; and "support" should read --support,--;
Line 32, "above)" should read --above),--;
Line 56, "thin" should read --thin,--;
Line 57, "suffi-" should be deleted; and
Line 58, "ciently exhibit a" should be deleted.

COLUMN 9

Line 13, "a resultant" should be deleted; and
Line 61, "atom" (both occurrences) should read --atoms--.

UNITED STATES PATENT AND TRADEMARK OFFICE
CERTIFICATE OF CORRECTION

PATENT NO. : 6,077,411
APPLICATION NO. : 09/008560
DATED : June 20, 2000
INVENTOR(S) : Tetsuro Nakamura It is certified that error appears in the above-identified patent and that said Letters Patent is hereby corrected as shown below:

COLUMN 10

Line 3, "junction," should read --junctions,--;
Line 19, "radio" should read --and radio--;
Line 21, "of" should read --of the--;
Line 22, "elements" should read --elements,--;
Line 33, "an" should read --a--;
Line 34, "an" should read --a--;
Line 36, "an" should read --a--; and
Line 59, "sheet or plate" should read --sheets or plates--.

COLUMN 11

Line 24, "tank" should read --tanks--.

COLUMN 12

Line 8, "the measurement," should read --these measurements,--; and
Line 15, "film" should read --film,--;
Line 57, "an" should read --and--.

COLUMN 13

Line 26, "the measurement," should read --these measurements,--;
Line 61, "dope" should read --doped--;
Line 63, "dope" should read --doped--;
Line 64, "dope" should read --doped--; and
Line 66, "dope" should read --doped--.

COLUMN 14

Line 1, "dope" should read --doped--;
Line 3, "dope" should read --doped--;
Line 39, "those" should read --these measurements--;
Line 50, "As" should read --As is--;
Line 52, "mances" should read --mance--; and
Line 65, "is excellent in" should read --has excellent--.

UNITED STATES PATENT AND TRADEMARK OFFICE
CERTIFICATE OF CORRECTION

| | |
|---|---|
| PATENT NO. | : 6,077,411 |
| APPLICATION NO. | : 09/008560 |
| DATED | : June 20, 2000 |
| INVENTOR(S) | : Tetsuro Nakamura |

It is certified that error appears in the above-identified patent and that said Letters Patent is hereby corrected as shown below:

CLAIM 20 SHOULD BE DELETED AND SUBSTITUTED WITH THE FOLLOWING CLAIM 20:

--20. A process for producing a photo-electricity generating device comprising the steps of:

forming a zinc oxide film on a sheet substrate comprising:

providing a tank containing an aqueous electrolytic solution containing at least nitrate ions and zinc ions;

continuously feeding and conveying an elongated electroconductive sheet substrate having two major surfaces in a direction by conveyor means while dipping a lengthwise portion of the sheet substrate in the electrolytic solution;

immersing a counter electrode in the electrolytic solution so as to be opposite to the lengthwise portion of the sheet substrate; and disposing a power supply so as to pass a current between the sheet substrate and the counter electrode, wherein said conveyer means include a plurality of rollers and an endless belt wound about the rollers so as to form a conveying path for said sheet substrate and including a conveyer surface contacting and covering one of the major surfaces of the lengthwise portion of the sheet substrate dipped in the electrolytic solution while

UNITED STATES PATENT AND TRADEMARK OFFICE
CERTIFICATE OF CORRECTION

PATENT NO. : 6,077,411　　　　　　　　　　　　　　　　　　　　　　　Page 5 of 5
APPLICATION NO. : 09/008560
DATED : June 20, 2000
INVENTOR(S) : Tetsuro Nakamura It is certified that error appears in the above-identified patent and that said Letters Patent is hereby corrected as shown below:

moving together with the sheet substrate, wherein the sheet substrate is substantially longer than the conveying path for said sheet substrate;

and forming a semiconductor layer on the zinc oxide film.--

Signed and Sealed this

Twelfth Day of September, 2006

JON W. DUDAS
*Director of the United States Patent and Trademark Office*